(12) United States Patent
Shuey (10) Patent No.: US 7,462,924 B2
(45) Date of Patent: Dec. 9, 2008

(54) ELECTRICAL CONNECTOR WITH ELONGATED GROUND CONTACTS

(75) Inventor: Joseph Blair Shuey, Camp Hill, PA (US)

(73) Assignee: FCI Americas Technology, Inc., Reno, NV (US)

( * ) Notice: Subject to any disclaimer, the term of this patent is extended or adjusted under 35 U.S.C. 154(b) by 131 days.

(21) Appl. No.: 11/477,068

(22) Filed: Jun. 27, 2006

(65) Prior Publication Data

US 2007/0296066 A1    Dec. 27, 2007

(51) Int. Cl.
*H01L 23/495* (2006.01)

(52) U.S. Cl. .................................. 257/666; 257/667

(58) Field of Classification Search ................ 257/666, 257/667
See application file for complete search history.

(56) References Cited

U.S. PATENT DOCUMENTS

| | | | |
|---|---|---|---|
| 3,286,220 A | 11/1966 | Marley et al. ............... | 439/680 |
| 3,538,486 A | 11/1970 | Shlesinger, Jr. ............. | 439/268 |
| 3,669,054 A | 6/1972 | Desso et al. ................. | 113/119 |
| 3,748,633 A | 7/1973 | Lundergan ............... | 339/217 S |
| 4,076,362 A | 2/1978 | Ichimura ..................... | 339/75 |
| 4,159,861 A | 7/1979 | Anhalt ........................ | 339/75 |
| 4,260,212 A | 4/1981 | Ritchie et al. ............. | 339/97 R |
| 4,288,139 A | 9/1981 | Cobaugh et al. .......... | 339/74 R |
| 4,383,724 A | 5/1983 | Verhoeven .................. | 439/510 |
| 4,402,563 A | 9/1983 | Sinclair ....................... | 339/75 |
| 4,560,222 A | 12/1985 | Dambach ..................... | 339/75 |
| 4,717,360 A | 1/1988 | Czaja ........................ | 439/710 |
| 4,776,803 A | 10/1988 | Pretchel et al. ............. | 439/59 |
| 4,815,987 A | 3/1989 | Kawano et al. ............ | 439/263 |
| 4,867,713 A | 9/1989 | Ozu et al. ................... | 439/833 |
| 4,907,990 A | 3/1990 | Bertho et al. ............... | 439/851 |
| 4,913,664 A | 4/1990 | Dixon et al. ................ | 439/607 |
| 4,973,271 A | 11/1990 | Ishizuka et al. ............. | 439/839 |
| 5,066,236 A | 11/1991 | Broeksteeg .................. | 439/79 |

(Continued)

FOREIGN PATENT DOCUMENTS

EP    0 273 683 A2    7/1988

(Continued)

OTHER PUBLICATIONS

Nadolny, J. et al., "Optimizing Connector Selection for Gigabit Signal Speeds", *ECN*™, Sep. 1, 2000, http://www.ecnmag.com/article/CA45245, 6 pages.

(Continued)

*Primary Examiner*—Marcos D Pizarro
*Assistant Examiner*—Bilkis Jahan
(74) *Attorney, Agent, or Firm*—Woodcock Washburn LLP (57) ABSTRACT

In an electrical connector, cross talk between signal contacts in adjacent linear columns and rows may be reduced by changing the size of the lead portions of the contacts extending within a leadframe housing. For example, the height of the ground contact lead portions may be increased to further isolate signal contacts in adjacent columns from interfering electrical fields. The height of the signal contact lead portions may be decreased in order to accommodate the larger ground contact lead portions without increasing the overall size of the connector. Smaller signal contact lead portions may reduce the overall length differential between signal contacts in a differential pair, thereby minimizing signal skew.

19 Claims, 7 Drawing Sheets

U.S. PATENT DOCUMENTS

| | | | |
|---|---|---|---|
| 5,077,893 A | 1/1992 | Mosquera et al. | 29/882 |
| 5,163,849 A | 11/1992 | Fogg et al. | 439/497 |
| 5,167,528 A | 12/1992 | Nishiyama et al. | 439/489 |
| 5,174,770 A | 12/1992 | Sasaki et al. | 439/108 |
| 5,238,414 A | 8/1993 | Yaegashi et al. | 439/108 |
| 5,254,012 A | 10/1993 | Wang | 439/263 |
| 5,274,918 A | 1/1994 | Reed | 29/882 |
| 5,277,624 A | 1/1994 | Champion et al. | 439/607 |
| 5,286,212 A | 2/1994 | Broeksteeg | 439/108 |
| 5,302,135 A | 4/1994 | Lee | 439/263 |
| 5,342,211 A | 8/1994 | Broeksteeg | 439/108 |
| 5,356,300 A | 10/1994 | Costello et al. | 439/101 |
| 5,356,301 A | 10/1994 | Champion et al. | 439/108 |
| 5,357,050 A | 10/1994 | Baran et al. | 174/33 |
| 5,431,578 A | 7/1995 | Wayne | 439/259 |
| 5,475,922 A | 12/1995 | Tamura et al. | 29/881 |
| 5,558,542 A | 9/1996 | O'Sullivan et al. | 439/682 |
| 5,586,914 A | 12/1996 | Foster, Jr., deceased et al. | 439/676 |
| 5,590,463 A | 1/1997 | Feldman et al. | 29/844 |
| 5,609,502 A | 3/1997 | Thumma | 439/747 |
| 5,713,746 A | 2/1998 | Olson et al. | 439/79 |
| 5,730,609 A * | 3/1998 | Harwath | 439/108 |
| 5,741,144 A | 4/1998 | Elco et al. | 439/101 |
| 5,741,161 A | 4/1998 | Cahaly et al. | 439/709 |
| 5,795,191 A | 8/1998 | Preputnick et al. | 439/608 |
| 5,817,973 A | 10/1998 | Elco et al. | 174/32 |
| 5,853,797 A | 12/1998 | Fuchs et al. | 427/96 |
| 5,908,333 A | 6/1999 | PErino et al. | 439/631 |
| 5,961,355 A | 10/1999 | Morlion et al. | 439/686 |
| 5,967,844 A | 10/1999 | Doutrich et al. | 439/607 |
| 5,971,817 A | 10/1999 | Longueville | 439/857 |
| 5,980,321 A | 11/1999 | Cohen et al. | 439/608 |
| 5,993,259 A | 11/1999 | Stokoe et al. | 439/608 |
| 6,050,862 A | 4/2000 | Ishii | 439/843 |
| 6,068,520 A | 5/2000 | Winings et al. | 439/676 |
| 6,116,926 A | 9/2000 | Ortega et al. | 439/108 |
| 6,116,965 A | 9/2000 | Arnett et al. | 439/692 |
| 6,123,554 A | 9/2000 | Ortega et al. | 439/79 |
| 6,125,535 A | 10/2000 | Chiou et al. | 29/883 |
| 6,129,592 A | 10/2000 | Mickievicz et al. | 439/701 |
| 6,139,336 A | 10/2000 | Olson | 439/83 |
| 6,146,157 A | 11/2000 | Lenoir et al. | 439/101 |
| 6,146,203 A | 11/2000 | Elco et al. | 439/609 |
| 6,171,115 B1 | 1/2001 | Mickievicz et al. | 439/76.1 |
| 6,171,149 B1 | 1/2001 | van Zanten | 439/608 |
| 6,190,736 B1 | 2/2001 | Reichart et al. | 439/736 |
| 6,212,755 B1 | 4/2001 | Shimada et al. | 29/527.1 |
| 6,219,913 B1 | 4/2001 | Uchiyama | 29/883 |
| 6,220,896 B1 | 4/2001 | Bertoncici et al. | 439/608 |
| 6,227,882 B1 | 5/2001 | Ortega et al. | 439/101 |
| 6,267,604 B1 | 7/2001 | Mickievicz et al. | 439/79 |
| 6,269,539 B1 | 8/2001 | Takahashi et al. | 29/883 |
| 6,280,209 B1 | 8/2001 | Bassler et al. | 439/101 |
| 6,293,827 B1 | 9/2001 | Stokoe et al. | 439/608 |
| 6,319,075 B1 | 11/2001 | Clark et al. | 439/825 |
| 6,322,379 B1 | 11/2001 | Ortega et al. | 439/108 |
| 6,322,393 B1 | 11/2001 | Doutrich et al. | 439/607 |
| 6,328,602 B1 | 12/2001 | Yamasaki et al. | 439/608 |
| 6,343,955 B2 | 2/2002 | Billman et al. | 439/608 |
| 6,347,952 B1 | 2/2002 | Hasegawa et al. | 439/608 |
| 6,350,134 B1 | 2/2002 | Fogg et al. | 439/79 |
| 6,354,877 B1 | 3/2002 | Shuey et al. | 439/608 |
| 6,358,061 B1 | 3/2002 | Regnier | 439/60 |
| 6,361,366 B1 | 3/2002 | Shuey et al. | 439/608 |
| 6,363,607 B1 | 4/2002 | Chen et al. | 29/883 |
| 6,364,710 B1 | 4/2002 | Billman et al. | 439/608 |
| 6,371,773 B1 | 4/2002 | Crofoot et al. | 439/79 |
| 6,375,478 B1 | 4/2002 | Kikuchi | 439/79 |
| 6,379,188 B1 | 4/2002 | Cohen et al. | 439/608 |
| 6,386,914 B1 | 5/2002 | Collins et al. | 439/579 |
| 6,409,543 B1 | 6/2002 | Astbury, Jr. et al. | 439/608 |
| 6,431,914 B1 | 8/2002 | Billman | 439/608 |
| 6,435,914 B1 | 8/2002 | Billman | 439/608 |
| 6,461,202 B2 | 10/2002 | Kline | 439/701 |
| 6,471,548 B2 | 10/2002 | Bertoncini et al. | 439/608 |
| 6,482,038 B2 | 11/2002 | Olson | 439/608 |
| 6,485,330 B1 | 11/2002 | Doutrich | 439/572 |
| 6,506,081 B2 | 1/2003 | Blanchfield et al. | 439/682 |
| 6,520,803 B1 | 2/2003 | Dunn | 439/608 |
| 6,527,587 B1 | 3/2003 | Ortega et al. | 439/608 |
| 6,537,111 B2 | 3/2003 | Brammer et al. | 439/857 |
| 6,540,559 B1 | 4/2003 | Kemmick et al. | 439/608 |
| 6,547,606 B1 | 4/2003 | Johnston et al. | 439/708 |
| 6,554,647 B1 | 4/2003 | Cohen et al. | 439/607 |
| 6,572,410 B1 | 6/2003 | Volstorf et al. | 439/608 |
| 6,652,318 B1 | 11/2003 | Winings et al. | 439/608 |
| 6,692,272 B2 | 2/2004 | Lemke et al. | 439/108 |
| 6,695,627 B2 | 2/2004 | Ortega et al. | 439/78 |
| 6,764,341 B2 | 7/2004 | Lappoehn | 439/608 |
| 6,776,649 B2 | 8/2004 | Pape et al. | 439/485 |
| 6,805,278 B1 | 10/2004 | Olson et al. | |
| 6,808,399 B2 | 10/2004 | Rothermel et al. | 439/108 |
| 6,827,611 B1 * | 12/2004 | Payne et al. | 439/608 |
| 6,848,944 B2 | 2/2005 | Evans | 439/608 |
| 6,851,974 B2 | 2/2005 | Doutrich | 439/572 |
| 6,869,292 B2 | 3/2005 | Johnescu et al. | 439/74 |
| 6,890,214 B2 | 5/2005 | Brown et al. | 439/608 |
| 6,913,490 B2 | 7/2005 | Whiteman, Jr. et al. | 439/608 |
| 6,932,649 B1 | 8/2005 | Rothermel et al. | 439/620 |
| 6,945,796 B2 | 9/2005 | Bassler et al. | 439/101 |
| 6,953,351 B2 | 10/2005 | Fromm et al. | 439/101 |
| 6,969,280 B2 | 11/2005 | Chien et al. | 439/608 |
| 6,981,883 B2 | 1/2006 | Raistrick et al. | 439/74 |
| 7,097,506 B2 | 8/2006 | Nakada | 439/608 |
| 7,131,870 B2 | 11/2006 | Whiteman, Jr. et al. | |
| 7,278,856 B2 * | 10/2007 | Minich | 439/65 |
| 2002/0098727 A1 | 7/2002 | McNamara et al. | |
| 2002/0106930 A1 | 8/2002 | Pape et al. | 439/485 |
| 2003/0220021 A1 | 7/2003 | Kline et al. | 439/608 |
| 2003/0171010 A1 * | 9/2003 | Winings et al. | 439/55 |
| 2003/0203665 A1 | 10/2003 | Ohnishi et al. | 439/79 |
| 2003/0143894 A1 | 11/2003 | Whiteman et al. | 439/608 |
| 2005/0009402 A1 | 1/2005 | Chien et al. | 439/608 |
| 2005/0118869 A1 | 6/2005 | Evans | 439/608 |
| 2006/0014433 A1 | 1/2006 | Consoli et al. | 439/608 |

FOREIGN PATENT DOCUMENTS

| | | |
|---|---|---|
| EP | 0 891 016 | 10/2002 |
| EP | 1 148 587 B1 | 4/2005 |
| JP | 06-236788 | 8/1994 |
| JP | 07-114958 | 5/1995 |
| JP | 11-185 886 | 7/1999 |
| JP | 2000-003743 | 1/2000 |
| JP | 2000-003744 | 1/2000 |
| JP | 2000-003745 | 1/2000 |
| JP | 2000-003746 | 1/2000 |
| WO | WO 90/16093 | 12/1990 |
| WO | WO 01/29931 A1 | 4/2001 |
| WO | WO 01/39332 A1 | 5/2001 |
| WO | WO 02/101882 | 12/2002 |

OTHER PUBLICATIONS

*Metral*™, "Speed & Density Extensions", *FCI*, Jun. 3, 1999, 25 pages.

"Lucent Technologies' Bell Labs and FCI Demonstrate 25gb/S Data Transmission over Electrical Backplane Connectors", Feb. 1, 2005, http://www.lucent.com/press/0205/050201.bla.html, 4 pages.

"B.? Bandwidth and Rise Time Budgets", Module 1-8. Fiber Optic Telecommunications (E-XVI-2a), http://cord.org/step_online/st1-8/st18exvi2a.htm, 3 pages 2006.

Fusi, M.A. et al., "Differential Signal Transmission through Backplanes and Connectors", *Electronic Packaging and Production*, Mar. 1996, 27-31.

Goel, R.P. et al., "AMP Z-Pack Interconnect System", 1990, AMP Incorporated, 9 pages.

"FCI's Airmax VS® Connector System Honored at DesignCon", 2005, Heilind Electronics, Inc., http://www.heilind.com/products/fci/airmax-vs-design.asp, 1 page.

Hult, B., "FCI's Problem Solving Approach Changes Market, The FCI Electronics AirMax VS®", ConnectorSupplier.com, Http://www.connectorsupplier.com/tech_updates_FCI-Airmax_archive.htm, 2006, 4 pages.

Backplane Products Overview Page, http://www.molex.com/cgi-bin/bv/molex/super_family/super_family.jsp?BV_Session ID=@, 2005-2006 © Molex, 4 pages.

AMP Z-Pack 2mm HM Interconnection System, 1992 amd 1994 © by AMP Incorporated, 6 pages.

HDM® HDM Plus® Connectors, http://www.teradyne.com/prods/tcs/products/connectors/backplane/hdm/index.html, 2006, 1 page.

Amphenol TCS (ATCS):HDM® Stacker Signal Integrity, http://www.teradyne.com/prods/tcs/products/connectors/mezzanine.hdm_stacker/signintegr, 3 pages 2006

VHDM High-Speed Differential (VHDM HSD), http://www.teradyne.com/prods/bps/vhdm/hsd.html, 6 pages 2000.

Amphenol TCS(ATCS): VHDM L-Series Connector, http://www.teradyne.com/prods/tcs/products/connectors/backplane/vhdm_1-series/index.html, 2006, 4 pages.

VHDM Daughterboard Connectors Featur press-fit Terminations and a Non-Stubbing Seperable Interface, © Teradyne, Inc. Connections Systems Division, Oct. 8, 1997, 46 pages.

HDM/HDM *plus*, 2mm Backplane Interconnection system, Teradyne Connection Systems, © 1993, 22 pages.

4.0 UHD Connector: Differential Signal Crosstalk, Reflections, 1998, pp. 8-9.

*Gig-Array® High Speed Mezzanine Connectors 15-40mm Board to Board*, Jun. 5, 2006, 1 page.

Communications, Data, Consumer Division Mezzanine High-Speed High-Density Connectors Gig-Array® and Meg-Array® Electrical Performance Data, 10 pags FCI Corporation, 2000.

AMP Z-Pack 2mm HM Connector, 2mm Centerline, Eight-Row, Right-Angle Applications, Electrical Performance Report, EPR 889065, Issued Sep. 1998, 59 pages.

AMP Z-Pack HM-Zd Performance at Gigabit Speeds, Tyco Electronics, Report #20GC014, Rev.B., May 4, 2001, 30 pages, "Tyco Electronics, Z-Dok and Connector", Tyco Electronics, Jun. 23, 2003, http://2dok.tyco.electronics.com, 15 pages.

Tyco Electronics/AMP, "Z-Dok and Z-Dok and Connectors", Application Specification # 114-13068, Aug. 30, 2005, Revision A, 16 pages.

Tyco Electronics, "Champ Z-Dok Connector System", Catalog # 1309281, Issued Jan. 2002, 3 pages.

"PCB-Mounted Receptacle Assemblies, 2.00 mm(0.079in) Centerlines, Right Angle Solder to Board Signal Receptacle", Metral, Berg Electronics, Sep. 22, 2004, 10-6, 10-7, 2 pages.

Framatome Connector Specification, Drafted May 10, 1999, 1 page.

MILLIPACS Connector Type A Specification, Printed Jul. 25, 2005, 1 page.

Metral 2mm High-Speed Connectors, 1000, 2000, 3000 Series, electrical Performance Data for Differential Applications, FCI Framatome Group, Sep. 22, 2004, 2 pages.

Amphenol TCS (ATCS): VHDM Connector, http://www.teradyne.com/prods/tcs/products/connectors/backplane /vhdm/index.html, Downloaded from Internet, Jan. 31, 2006, 2 pages.

HCM Separable Interface Detail, Molex, Jul. 29, 1996 (Approved), 3 pages.

Honda Connectors, "Honda High-Speed Backplane Connector NSP Series", Honda Tsushin Kogoyo Co., Ltd., Development Engineering Division, Tokyo, Japan, Feb. 7, 2003, 25 pages.

NSP, Honda The World Famous Connectors, http://www.honda-connectors.co.jp, 6 pages, English Language Translation attached

* cited by examiner

ELECTRICAL CONNECTOR WITH ELONGATED GROUND CONTACTS

BACKGROUND

Minimizing the adverse affects of signal skew and crosstalk are two well-known challenges associated with the design of electrical connectors. Crosstalk results from interference on a signal conductor generated from other signal conductors in the connector. A common approach to reducing crosstalk includes interspersing ground contacts among the signal contacts. Typically, such ground contacts are about the same size as the signal contacts. Because of their size, however, the ability of ground contacts to isolate adjacent signal contacts from interfering electrical fields may be limited.

Skew results from the propagation of different signals along conductors of different lengths. Minimizing skew is an especially difficult challenge in the case of right-angle connectors, which typically include electrical contacts of differing lengths. In such a connector, the end-to-end propagation times for the respective signals in a differential signal pair tend to vary, thereby resulting in signal skew.

SUMMARY

An electrical connector that minimizes cross talk and signal skew is disclosed and claimed herein. The electrical connector may include a column of electrical contacts, which may include lead portions that are housed within a leadframe assembly and mating ends that extend from the leadframe assembly. The column of electrical contacts may also include differential signal pairs, single-ended signal contacts, and/or ground contacts. For example, the column may include at least one ground contact adjacent to at least one differential signal pair of electrical contacts.

Cross talk between signal contacts in adjacent columns and rows may be limited to a desirable level as a result of the size and/or configuration of the electrical contacts. For example, the signal contacts and grounds contacts may be staggered between adjacent columns. Thus, a signal pair contact in a first column may be adjacent to a ground contact in a second adjacent column. Cross talk between signal contacts in adjacent linear columns and rows may also be reduced by changing the size of the lead portions of the contacts extending within a leadframe housing. For example, the height of the ground contact lead portions may be increased to further isolate signal contacts in adjacent columns from interfering electrical fields. In addition, the height of the signal contact lead portions may be decreased in order to accommodate the larger ground contact lead portions without increasing the overall size of the connector. Furthermore, smaller signal contact lead portions may reduce the overall length differential between signal contacts in a differential pair, thereby minimizing signal skew.

DETAILED DESCRIPTION OF ILLUSTRATIVE EMBODIMENTS

Figure 1:
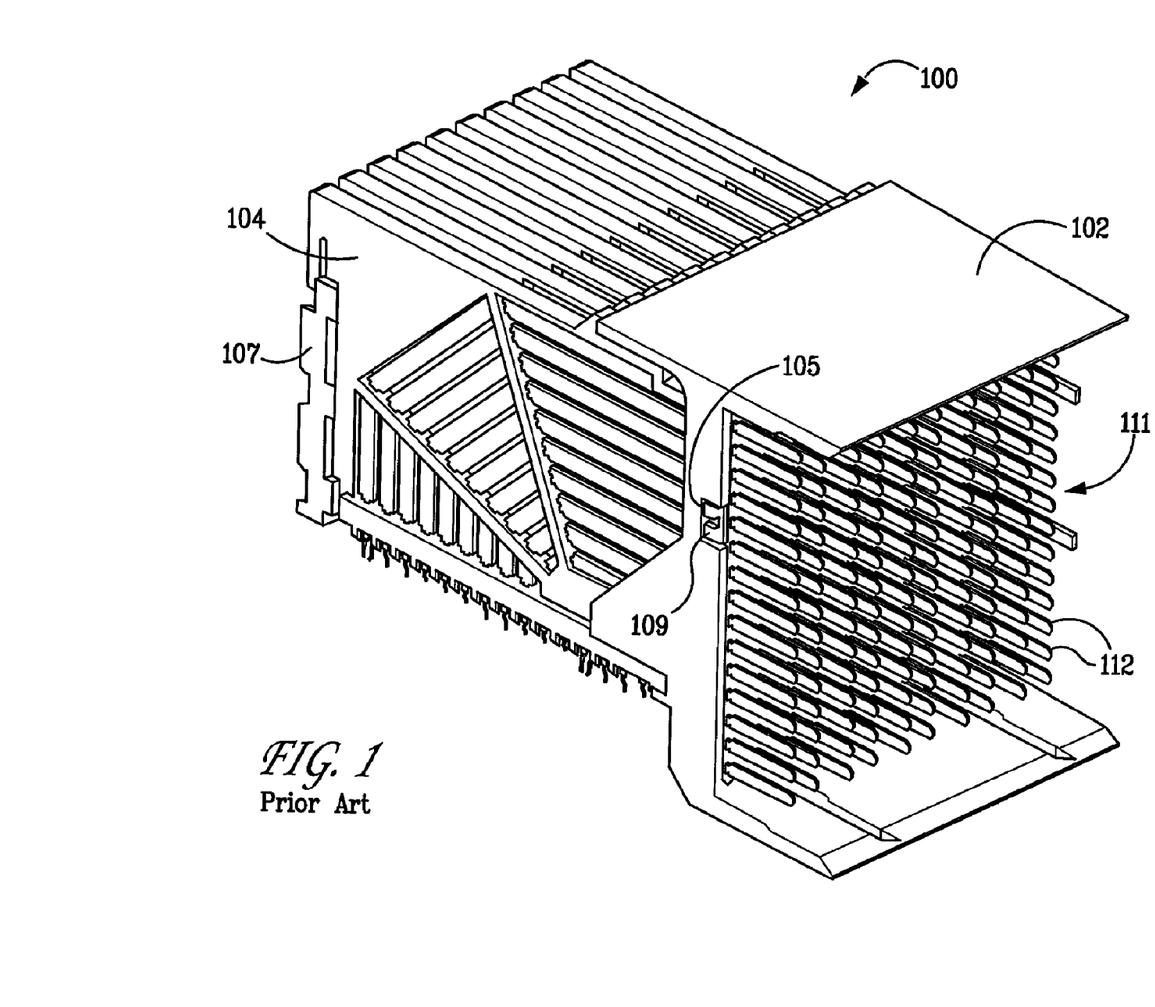
FIG. 1 is a perspective view of an example prior art electrical connector.

FIG. 1 is a perspective view of an example prior art electrical connector 100. As shown, the electrical connector 100 may be a right-angle connector, having a mating side that is adapted to mate with a complementary receptacle connector, and a mounting side that is adapted to be electrically connected to a substrate such as a printed circuit board. The connector 100 may be mounted to a printed circuit board via any suitable surface-mount or through-mount technology, such as, for example, solder ball grid array, press fit, and the like.

The connector 100 may include one or more leadframe assemblies 104. Each leadframe assembly 104 may include an arrangement of electrical contacts 111, which may be signal contacts or ground contacts. The electrical contacts 111 may be arranged in linear arrays, such as in columns as shown.

Each leadframe assembly 104 may be received in a housing 102 of the connector 100. The leadframe assemblies 104 may include protrusions 105 that may latch in complementary indentations 109 defined by the housing 102. The housing 102 may be adapted to align and retain the leadframe assemblies 104 with respect to one another. For example, the housing 102 may define slots or include any other suitable configuration for receiving a portion of the leadframe assemblies 104.

Additionally, a retention member 107 may be connected to the leadframe assemblies 104 and may aid in maintaining the leadframe assemblies 104 in the connector 100. The housing 102 and the retention member 107 may be made from any suitable material, such as plastic.

Figure 2:
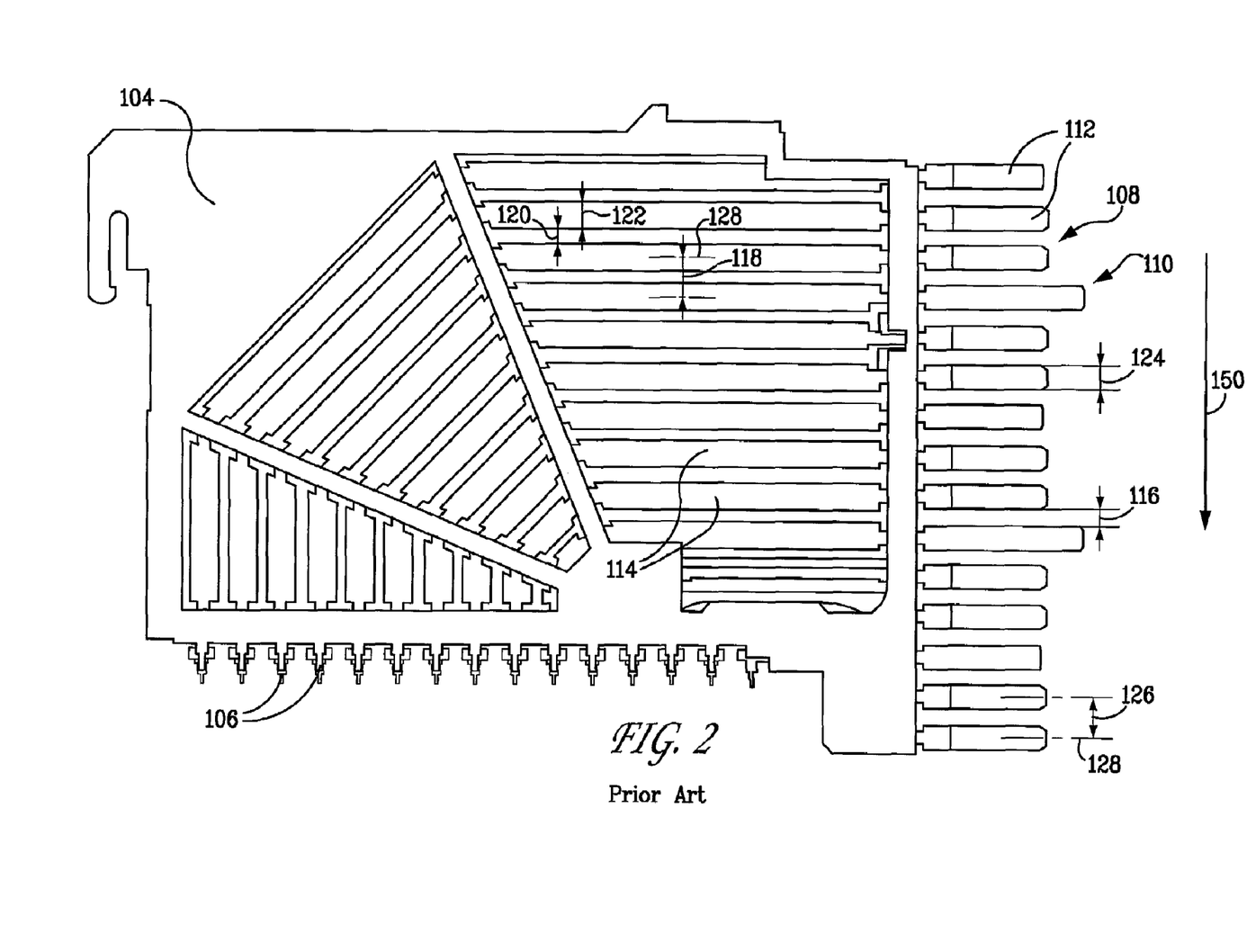
FIG. 2 is a side view of an example prior art leadframe assembly.

FIG. 2 is a side view of an example leadframe assembly 104. The leadframe assembly 104 may include a column of electrical contacts, such as signal contacts 108 and/or ground contacts 110. The electrical contacts may be used for differential or single-ended signal transmission. Each contact 108, 110 may include a lead portion 114 extending in an interior of the leadframe assembly 104. Each contact 108, 110 may include a terminal end 106 for connecting to a substrate such as a printed circuit board.

Each contact 108, 110 additionally may include a mating end 112 for mating with, for example, a respective contact of a second connector. As shown in FIG. 2, the mating ends 112 of the ground contacts 110 may extend further than the mating ends 112 of the signal contacts 108 to facilitate mating of ground contacts before mating of signal contacts when connecting to a second connector.

The mating ends 112 of the contacts 108, 110 may define a broadside length 124 extending in a direction indicated by the arrow 150, that is, in a direction in which the column of contacts 108, 110 extends. The respective broadside length 124 of each mating end 112 of the signal and ground contacts 108, 110 may be equal. Alternatively, the respective broadside lengths 124 of the mating ends 112 of the ground contacts 110 may be different from that of the signal contacts 108. In one example embodiment, the broadside length 124 of the mating ends 112 of the signal and ground contacts 108, 110 is 1.05 mm. Adjacent mating ends 112 of the contacts 108, 110 may be separated by respective gaps 116. The gaps 116 may be the same between all mating ends 112 or may be different. For example, the gaps 116 may be about 0.3-0.7 mm.

The lead portions 114 of the signal contacts 108 and ground contacts 110 may define the height 122 extending in the direction indicated by the arrow 150, that is, in the direction in which the column of contacts 108, 110 extend. Adjacent lead portions 114 in the leadframe assembly 104 may be separated by a gap 120. Each gap 120 may be filled with a dielectric material such as, for example, air or plastic.

The mating ends 112 and the lead portions 114 of the contacts 108, 110 each may define a centerline 128. A distance between centerlines 128 of adjacent mating ends 112 may be a distance 126. In one example embodiment, the distance 126 between adjacent contacts is 1.4 mm. A distance between centerlines 128 of adjacent lead portions 114 may be a distance 118. The distance 126 may be the same as or different from the distance 118.

Additionally, the value of the distance 118 between adjacent signal contacts 108 in the leadframe assembly 104 may affect the overall length differential of adjacent signal contacts 108. For example, each lead portion 114 in the leadframe assembly 104 may define a portion of a circumference, which may correspond to the length of each respective lead portion 114. Thus, a larger distance 118 may increase the circumference differential between adjacent lead portions 114 and, therefore, increase the overall length differential between adjacent lead portions 114. Consequently, the disparity in end-to-end propagation time for each signal on adjacent signal contacts 108 may promote signal skew between adjacent signal contacts 108 in the leadframe assembly 104.

The leadframe assembly 104 in connector 100 may contain any arrangement of signal contacts 108 and ground contacts 110. That is, the arrangement, from top to bottom, may start with a differential pair of signal contacts 108. Alternatively, the arrangement, from top to bottom, may start with a ground contact 110 or with a single-ended signal contact 108.

Furthermore, and with reference to FIG. 1, adjacent leadframe assemblies 104 may include varying arrangements of signal and ground contacts 108, 110. For example a ground contact 110 of a first leadframe assembly 104A may be adjacent to a signal contact 108 of a second leadframe assembly 104B. Such an arrangement may reduce cross talk between adjacent columns of signal contacts 108.

Figure 3:
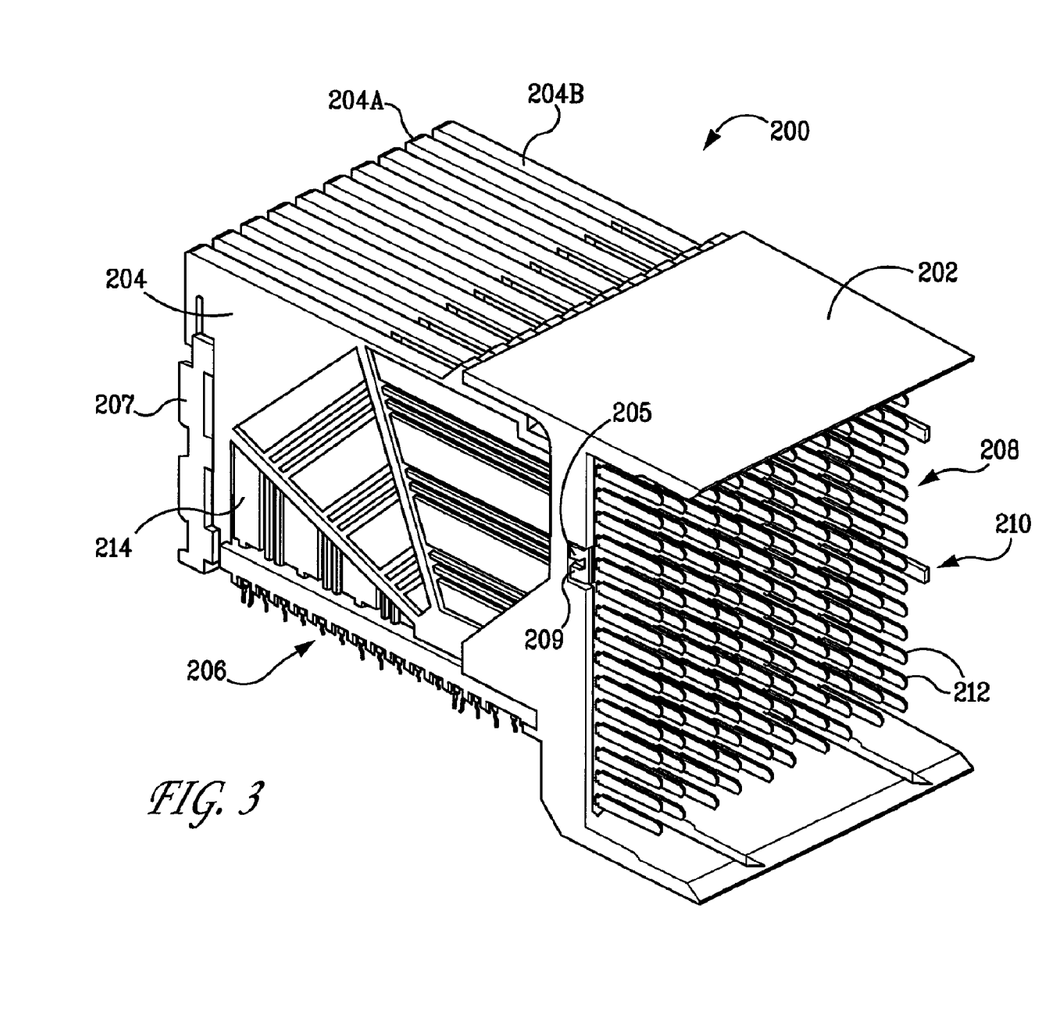
FIG. 3 is a perspective view of an example embodiment of an electrical connector according to the invention.

FIG. 3 is a perspective view of an example electrical connector 200 according to the invention. The electrical connector 200 may mate with another electrical connector and may also be electrically connected to a substrate such as a printed circuit board. The connector 200 may be mounted to a printed circuit board by any suitable method such as, for example, surface mount technology, solder ball grid array, press fit, and the like. As shown in FIG. 3, connector 200 may be a male, or plug, connector. In alternative embodiments, the connector 200 may be a female, or receptacle, connector. The connector 200 may be a right-angle, a mezzanine, or other type of connector.

The connector 200 may include one or more leadframe assemblies 204. The leadframe assemblies 204 may be insert molded. Each leadframe assembly 204 may be received in a housing 202 of the connector 200. For example, the leadframe assemblies 204 may include protrusions 205 that may latch in indentations 209 defined by the housing 202. The housing 202 may be adapted to align and retain the leadframe assemblies 204 with respect to one another. For example, the housing 202 may define slots or include any other suitable configuration for receiving a portion of the leadframe assemblies 204.

Additionally, a retention member 207 may be connected to the leadframe assemblies 204 and may aid in maintaining the leadframe assemblies 204 in the connector 200. The housing 202 and the retention member 207 may be made from any suitable material, such as plastic. Each leadframe assembly 204 may include signal contacts 208 and ground contacts 210. The leadframe assemblies 204 may define a column of the signal contacts 208 and/or the ground contacts 210.

The leadframe assemblies 204 may include signal contacts 208 and ground contacts 210 arranged in a column. The signal contacts 208 may be for differential or single-ended signal transmissions. Each of the contacts 208, 210 may include a mating end 212, a lead portion 214 and a terminal end 206. The mating ends 212 may be blade-shaped. The signal and ground contacts 208, 210 may be arranged in any order in each leadframe assembly 204. Thus, the order of signal contacts 208 and ground contacts 210 in one leadframe assembly 204 may be the same as or different from that of other leadframe assemblies 204. For example, a leadframe assembly 204A may include, at the top-most contact, a ground contact 210 whereas an adjacent leadframe assembly 204B may include, at the top-most contact, a signal contact 208.

Figure 4:
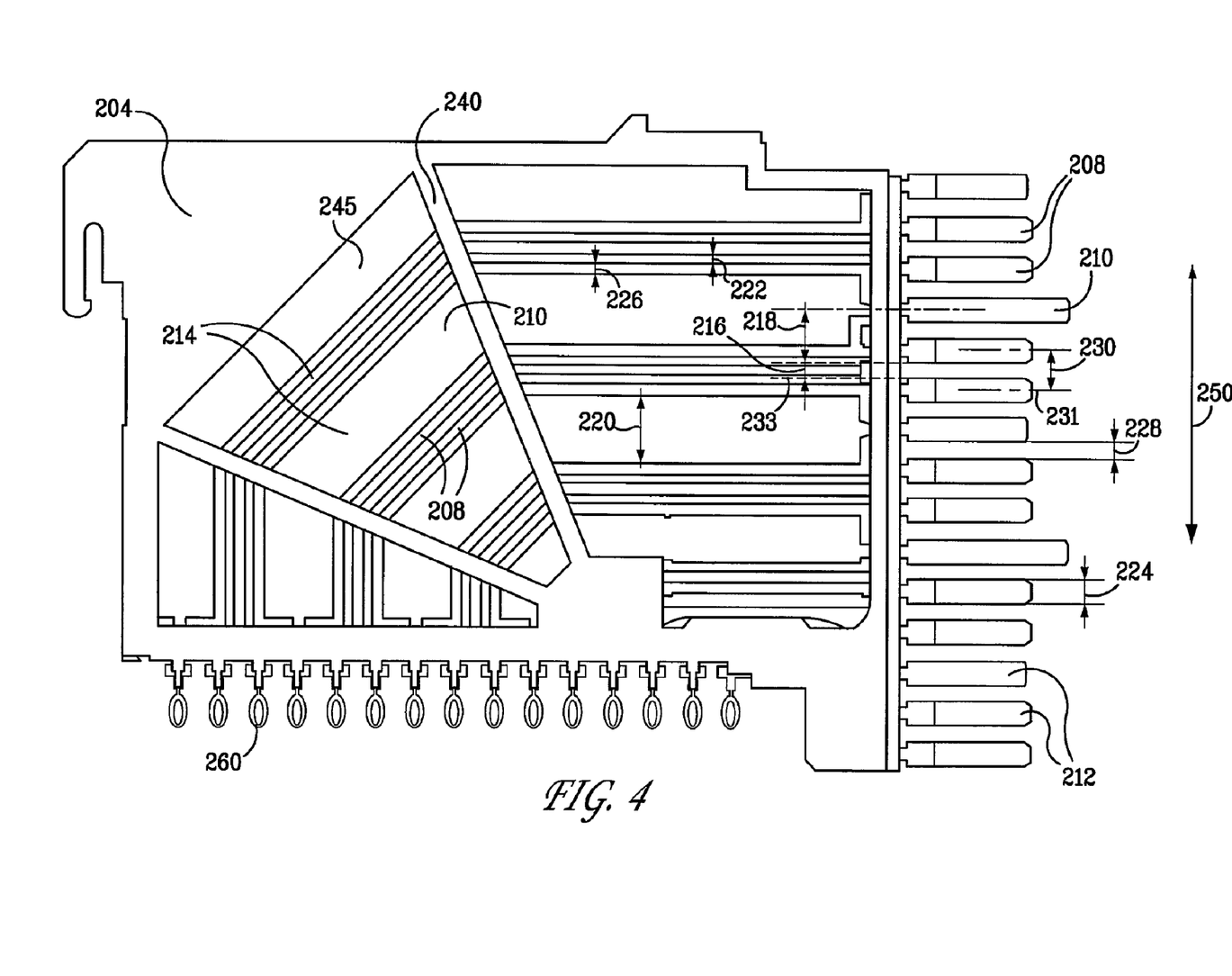
FIG. 4 is a side view of an example embodiment of a leadframe assembly according to the invention.

FIG. 4 is a side view of an example leadframe assembly 204. The leadframe assembly 204 may include a leadframe housing 240 and a leadframe 245 of contacts 208, 210. The contacts 208, 210 each may include a mating end 212, a lead portion 214 extending from the mating end 212 through the leadframe housing 240, and a mounting end 260. The mating end 212 may be for connecting to a complementary contact of another connector, and the mounting end 260 may be for connecting to a substrate such as a printed circuit board.

The leadframe assembly 204 may include signal contacts 208 and ground contacts 210. The mating end 212 of the signal and ground contacts 208, 210 may define a broadside length 224. The broadside length 224 may be the same as the broadside length 124 described in FIG. 2. In one example embodiment, the broadside length 224 of the mating ends 212 of the signal and ground contacts 108, 110 is 1.05 mm. Alternatively, the broadside length 224 may be less than or greater than the broadside length 124. Each mating end 212 may be separated by a gap 228 from adjacent mating ends 212. The gap 228 may be a distance equal to, greater than, or less than the gap 116 described in FIG. 2. For example, the gap 228 may be about 0.65 mm. Each mating end 212 may define a centerline 231. A distance 230 may be defined between centerlines 231 of adjacent mating ends 212. The distance 230 may be less than, the same as, or greater than the distance 126 described in FIG. 2. In one example embodiment, the distance 230 between adjacent contacts is 1.4 mm.

The lead portions 214 of the signal contact 208 may define a side length 222. The side length 222 of the lead portion 214 of the signal contact 208 may be less than the broadside length 224 of the mating end 212 of the signal contact 208. In one example embodiment, the side length 222 may be about 0.425 mm. The lead portions 214 of the signal contacts 208 may define respective centerlines 233. A distance 216 may be defined between centerlines 233 of adjacent lead portions 214 of signal contacts 208. The centerlines 233 of the lead portions 214 of signal contacts 208 may be offset in the direction in which the contact column extends (i.e., in a direction indicated by the arrow 250) with respect to the centerlines 231 of the mating ends 212 of the respective signal contacts 208. The distance 216 may be greater than, equal to, or less than the distance 118 described in FIG. 2. The distance 216 may be about 0.7 mm, with the gap between adjacent signal contacts being about 0.35 mm. Thus, as will be appreciated by one skilled in the art, a distance 218 between the centerlines of adjacent signal and ground contacts may be more than twice the distance 216.

As the distance 216 (i.e., the distance between centerlines 233 of adjacent lead portions 214 of signal contacts 208) may be less than the distance 118 of FIG. 2, the overall length differential between adjacent signal contacts 208 in the leadframe assembly 204 may be smaller than the overall length differential between adjacent signal contacts 108 in the leadframe assembly 104. For example, in the prior art leadframe assembly depicted in FIG. 2, the ratio of the lengths of the lead portions 214 of adjacent signal contacts may be about 89-94%. In a leadframe assembly according to the invention, the length ratio between adjacent signal contacts may be about 93-97%. This decrease in the length differential may aid in reducing signal skew between adjacent signal contacts 208 in the connector 200.

The lead portions 214 of the ground contacts 210 may be separated by a gap 226 from the lead portions 214 of the signal contacts 208. The lead portions 214 of the signal contacts 208 may be separated by the gap 226 as well. The gap 226 may be less than, equal to, or greater than the gap 120 described in FIG. 2, and may be defined to control impedance within the leadframe assembly 204. The gap 226 may be about 0.3 mm, for example. A distance 217 between adjacent ground contacts within a column may be about 1.75 mm.

Each lead portion 214 of the ground contacts 210 may define a height 220. The height 220 may be greater than the height 122 described with regard to FIG 2. The height 220 additionally may be greater than the broadside length 224 of the mating end 212 of the ground contacts 210.

In one example embodiment, the height 220 may be greater than the side lengths 222 of two adjacent lead portions 214 of signal contacts 208, including the gap 226 between the lead portions 214. The leadframe assembly 204A with a signal contact pair at the top may be placed adjacent to the leadframe assembly 204B with a ground contact at the top. The lead portion 214 of the ground contacts 210 may include a height 220 such that they act as a shield for the lead portions 214 of the signal contacts 208 of the adjacent leadframe assembly. In one example embodiment, the height 220 may be 2.45 mm.

Figure 5:
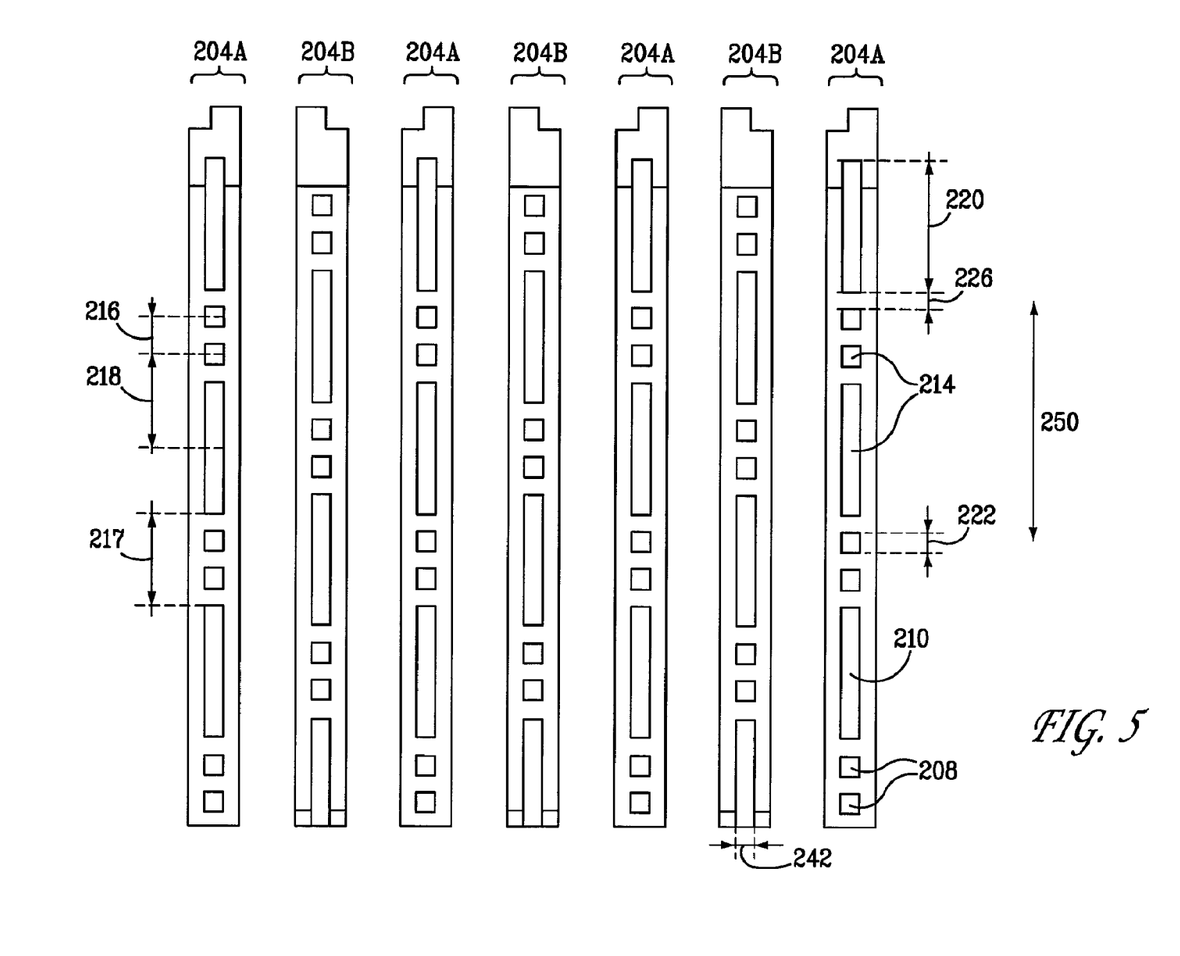
FIG. 5 is a cross-sectional view of a plurality of adjacent leadframe assemblies.

FIG. 5 is a cross-sectional view of a plurality of adjacent leadframe assemblies 204A, 204B. Each leadframe assembly 204A, 204B may define a column of signal and ground contacts 208, 210. The leadframe assemblies 204A may include a ground contact 210 at the top and the leadframes 204B may include a pair of signal contacts 208 at the top. The connector 200 may include any number of leadframe assemblies 204A and 204B. Furthermore, the leadframe assemblies 204A and 204B may include any number and/or configuration of signal contacts 208 and ground contacts 210.

The lead portions 214 of signal and ground contacts 208, 210 each may define a width 242 extending in a direction perpendicular to the direction in which the contact columns extend (i.e., in a direction perpendicular to a directions indicated by the arrow 250). While the widths 242 of the contacts 208, 210 are uniform in the embodiment of FIG. 5, in alternative embodiments, the widths of the contacts 208, 210 may vary.

The lead portions 214 of the signal contacts 208 may define a side length 222, which may be greater than, equal to, or less than the 242. The lead portions 214 of the ground contacts 210 may define a height 220, which may be greater than the width 242 and as well as the side length 222 of the signal contacts 208. As shown, the height 220 may be greater than twice the side length 222 of the signal contacts 208. The height 220 may be greater than the distance between adjacent ground contacts 210.

As shown in FIG. 5, the signal contacts 208 and ground contacts 210 in the leadframe assemblies 204A, 204B may be staggered with respect to one another. For example, the top of the leadframe assembly 204A may begin with a ground contact 210, and the top of the leadframe assembly 204B may begin with two signal contact 208, which may form a differential signal pair. In an embodiment, the lead portions 214 of the signal and ground contacts 208, 210 may be sized such that the lead portions 214 of a pair of signal contacts 208 in the leadframe assembly 204A both may be adjacent to the lead portion 214 of a single ground contact 210 in the leadframe assembly 204B. Similarly, the lead portions 214 of a pair of signal contacts 208 in the leadframe assembly 204B may be adjacent to the lead portion 214 of a single ground contact 210 in the leadframe assembly 204A. The height 220 of the lead portion 214 of the ground contacts 210 may be such that each "overlaps" the signal contacts of an adjacent leadframe assembly 204A, 204B, in the directions indicated by the arrow 250. In this way, the ground contacts 210 may perform as shields and may improve the signal integrity of the connector 200.

Figure 6A:
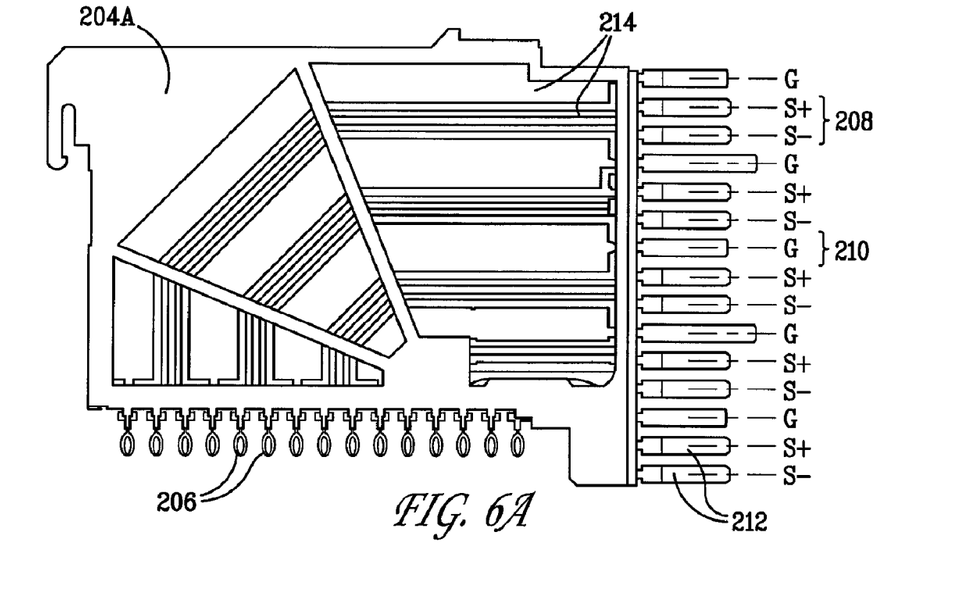
FIGS. 6A and 6B are side views of alternate embodiments of leadframe assemblies according to the invention.

FIGS. 6A and 6B are side views of leadframe assemblies 204A, 204B, respectively. As shown in FIG. 6A, signal contacts 208 and ground contacts 210 in the leadframe assembly 204A may be arranged, from top to bottom, in the following order (with G referring to a ground contact 210 and S+ and S− referring to signal contacts 208 of a differential pair): G, S+, S−, G, S+, S−, G, S+, S−, G, S+, S−, G, S+, S−. Thus, the top of the leadframe assembly 204A may begin with a ground contact 210. Each ground contact 210 in the leadframe assembly 204A may be separated by signal contacts 208, which may form a differential signal pair of electrical contacts.

Figure 6B:
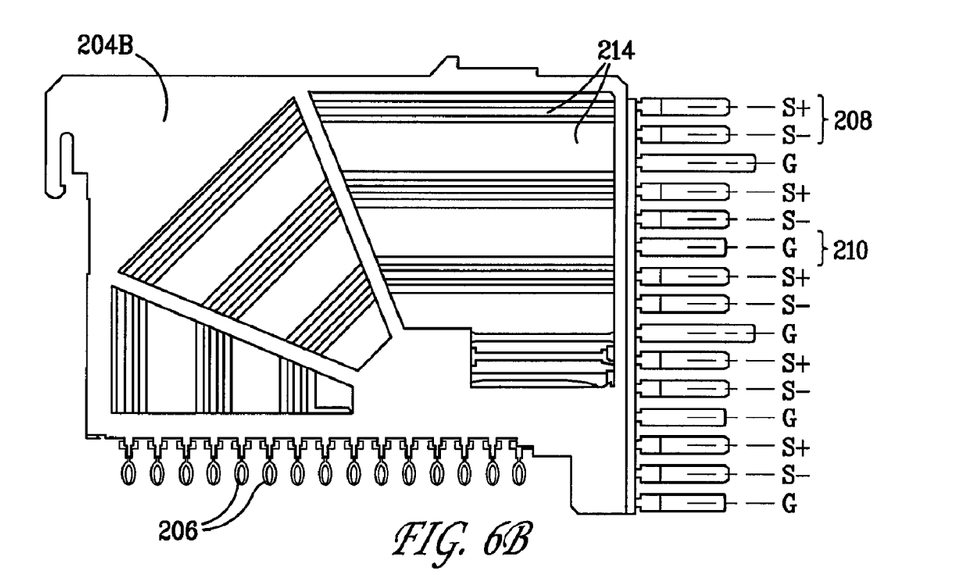

As shown in FIG. 6B, signal contacts 208 and ground contacts 210 in the leadframe assembly 204B may be arranged, from top to bottom, in the following order: S+, S−, G, S+, S−, G, S+, S−, G, S+, S−, G, S+, S−, G. Thus, the top of the leadframe assembly 204B may begin with signal contacts 208 of a differential signal pair. Each differential signal pair may be separated by a ground contact 210.

As shown in FIGS. 2 and 5, the leadframe assemblies 204 may be received in the connector 200 such that the leadframe assemblies 204A are adjacent to the leadframe assemblies 204B. In this way, signal contacts 208 of a differential signal pair of one leadframe assembly, such as the leadframe assembly 204A, may be adjacent to a ground contact 210 of a second leadframe assembly, such as the leadframe assembly 204B.

Figure 7:
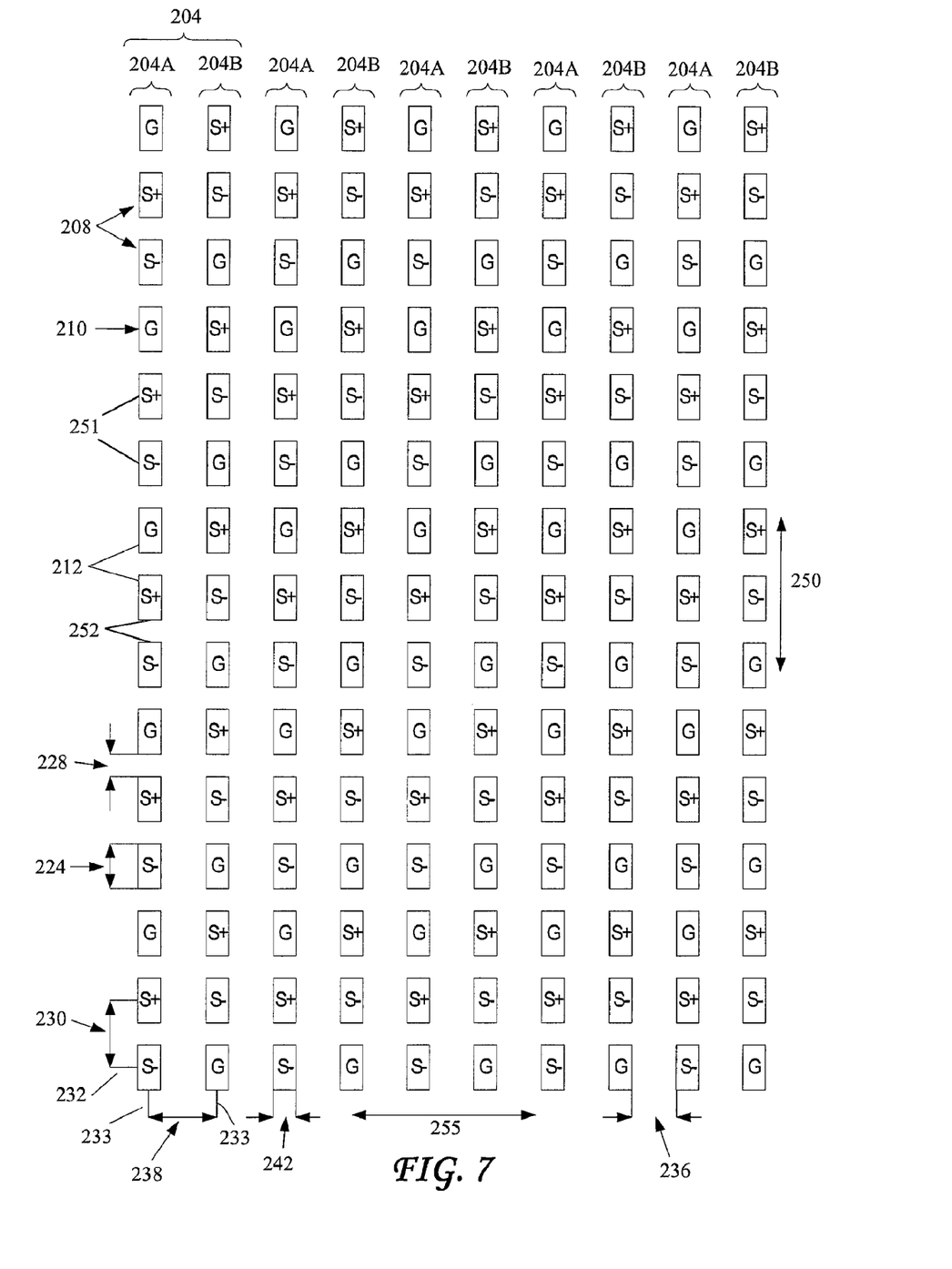
FIG. 7 depicts an example arrangement of contact mating ends.

FIG. 7 represents an arrangement of mating ends 212 of contacts 208, 210 of the connector 200. That is, the connector 200 may include leadframe assemblies 204A, 204B. Each leadframe assembly 204A may include an identical contact arrangement as each of every other leadframe assembly 204A in the connector 200. Each leadframe assembly 204B may include an identical contact arrangement as each of every other leadframe assembly 204B in the connector 200. The leadframe assemblies 204A may include a different order of signal and ground contacts 208, 210 than the leadframe assemblies 204B. The leadframe assemblies 204A may alternate with the leadframe assemblies 204B.

While contact mating ends may be circular or square, in the embodiment depicted in FIG. 5, the mating ends 212 define a rectangular cross section. That is, each of the mating ends 212 of the contacts 208, 210 may define a broadside 251 and an edge 252. The contacts 208, 210 may be arranged such that an edge 252 of a first signal contact 208 of a differential signal pair is adjacent to an edge 252 of a second signal contact 208 of the pair. Of course, alternative embodiments may include contacts for single-ended signal transmission.

The mating ends 212 of the signal contacts 208 and/or the ground contacts 210 may define a broadside length 224 in a direction indicated by the arrow 250, that is, in a direction in which the contact column extends. The mating ends of the contacts 208, 210 additionally may define a width 242 in a direction indicated by the arrow 255, that is, in a direction perpendicular to the direction in which the contact column extends.

The center of a mating end 212 of a contact 208, 210 in a first contact column and a center of a mating-end 212 of a contact 208, 210 in an adjacent contact column may define a centerline 232 extending in the direction indicated by the arrow 255. That is, the centerline 232 may be defined along a row of contacts 208, 210, where the row extends perpendicular to the column. A distance between adjacent centerlines 232 may be a distance 230. The distance 230 may be less than, equal to, or greater than the distance 126 shown in FIG. 2.

The center of mating ends 212 of contacts 208, 210 in a contact column may define a centerline 233 extending in the direction indicated by the arrow 250. A distance between adjacent centerlines 233 may be a distance 238. The distance 238 may be less than, equal to, or greater than the distance 230.

Adjacent mating ends 212 in each column may be separated by a gap 228 in the directions indicated by the arrow 250 (i.e., along the contact column). Adjacent mating ends 212 in each row may be separated by a gap 236. The gap 228 may be less than, equal to, or more than the gap 236.

One or more of the distances 230, 238, and/or of the gaps 228, 236, and/or the heights 220, 222 of ground and signal contacts 210, 208 may be adjusted to achieve acceptable cross talk levels, matched impedance, and acceptable signal skew. In alternative embodiments, these values may be variably adjusted to achieve, for example, worst-case, asynchronous, multi-active cross talk of 6% or less at signal rise times of 200 to 30 picoseconds. Moreover, impedance may about 100±10 Ohms. Alternatively, impedance may be about 85±10 Ohms.

What is claimed:

1. A leadframe assembly for an electrical connector, the leadframe assembly comprising:
   a dielectric leadframe housing; and
   a linear array of electrical contacts, each of the electrical contacts extending through the leadframe housing, the linear array extending along a first direction and including a first ground contact, a first signal contact positioned adjacent to the first ground contact, a second signal contact positioned adjacent to the first signal contact, and a second ground contact positioned adjacent to the second signal contact,
   wherein (i) the first and second ground contacts are separated by a first distance along the first direction, and (ii) each of the first and second ground contacts defines a respective lead portion thereof having a side length along the first direction that is greater than the first distance.

2. The leadframe assembly of claim 1, wherein (i) each of the first and second signal contacts defines a respective lead portion thereof having a side length along the first direction, and (ii) the respective side lengths of the lead portions of the first and second signal contacts are approximately equal.

3. The leadframe assembly of claim 2, wherein (i) each of the lead portions defines a respective edge width along a second direction that is substantially perpendicular to the first direction, and (ii) each of the edge widths is less than half the side length of the lead portion of the first ground contact.

4. The leadframe assembly of claim 3, wherein the edge widths of the first and second signal contacts are approximately equal to the respective side lengths of the first and second signal contacts.

5. The leadframe assembly of claim 1, wherein the first signal contact and the second signal contact form a differential signal pair of electrical contacts.

6. The leadframe assembly of claim 1, wherein (i) the lead portion of the first ground contact defines a first centerline, (ii) the lead portion of the first signal contact defines a second centerline, (iii) the lead portion of the second signal contact defines a third centerline, (iv) the first centerline and the second centerline are separated by a second distance, and (v) the second centerline and the third centerline are separated by a third distance that is less than the second distance.

7. The leadframe assembly of claim 6, wherein (i) the leadframe housing defines a mating face thereof, (ii) each of the first and second signal contacts defines a respective mating end thereof that extends beyond the mating face of the leadframe housing, (iii) each of the first and second ground contacts defines a respective mating end thereof that extends beyond the mating face of the leadframe housing, and (iv) the mating end of the second ground contact extends farther beyond the mating face of the leadframe housing than the mating ends of the first and second signal contacts.

8. The leadframe assembly of claim 7, wherein each of the mating ends is blade-shaped.

9. The leadframe assembly of claim 7, wherein the mating end of the second ground contact extends farther beyond the mating face of the leadframe housing than does the mating end of the first ground contact.

10. The leadframe assembly of claim 2, wherein (i) the leadframe housing defines a mounting face and a mating face, (ii) the lead portion of the first signal contact extends a first lead length from the mating face to the mounting face, (iii) the lead portion of the second signal contact extends a second lead length from the mating face to the mounting face, and (iv) the second lead length is greater than 94% of the first lead length.

11. A leadframe assembly for an electrical connector, the leadframe assembly comprising:
    a dielectric leadframe housing; and
    a linear array of electrical contacts, each of the electrical contacts extending through the leadframe housing, the linear array extending along a first direction and including a first ground contact, a first signal contact positioned adjacent to the first ground contact, and a second signal contact positioned adjacent to the first signal contact,
    wherein (i) the first signal contact comprises a first lead portion that defines a first centerline, (ii) the second signal contact comprises a second lead portion that defines a second centerline, (iii) the first ground contact comprises a third lead portion that defines a third centerline, (iv) the first and second centerlines are separated by a first distance along the first direction, and (v) the second and third centerlines are separated by a second distance along the first direction that is more than twice the first distance.

12. The leadframe assembly of claim 11, wherein the first signal contact and the second signal contact form a differential signal pair of electrical contacts.

13. The leadframe assembly of claim 11, wherein (i) the first signal contact defines a first mating end that defines a fourth centerline, (ii) the second signal contact defines a second mating end that defines a fifth centerline, (iii) the first ground contact defines a third mating end that defines a sixth centerline, (iv) the fourth centerline and the fifth centerline are separated by a third distance, (v) the fourth centerline and the sixth centerline are separated by a fourth distance, and (vi) the third distance and the fourth distance are approximately equal.

14. The leadframe assembly of claim 13, wherein (i) the leadframe housing defines a mating face thereof, and (ii) the mating end of the first ground contact extends farther beyond the mating face of the leadframe housing than the mating ends of the first and second signal contacts.

15. The leadframe assembly of claim 14, wherein the mating end of the first signal contact extends beyond the mating face of the leadframe housing by approximately the same distance as the mating end of the second signal contact.

16. The leadframe assembly of claim 13, wherein each of the mating ends is blade-shaped.

17. An electrical connector, comprising:
a first leadframe assembly comprising a first dielectric leadframe housing and a first linear array of electrical contacts extending through the first leadframe housing, the first linear array extending along a first direction and including a first signal contact and a second signal contact positioned adjacent to the first signal contact; and
a second leadframe assembly positioned adjacent to the first leadframe assembly, the second leadframe assembly comprising a second dielectric leadframe housing and a second linear array of electrical contacts extending through the second leadframe housing, the second linear array including a first ground contact,
wherein (i) each of the first and second signal contacts defines a respective lead portion thereof having a first edge, a second edge opposite the first edge, and a broadside extending from the first edge thereof to the second edge thereof, (ii) the first edge of the first signal contact is positioned adjacent to the first edge of the second signal contact, (iii) the second edge of the first signal contact is spaced apart from the second edge of the second signal contact by a first distance along the first direction, (iv) the first ground contact defines a respective lead portion thereof having a first edge, a second edge opposite the first edge, and a broadside extending from the first edge thereof to the second edge thereof, (v) the first ground contact is adjacent to each of the first and second signal contacts in a direction that is perpendicular to the first direction, and (vi) the broadside of the first ground contact extends more than the first distance in the first direction.

18. The electrical connector of claim 17, wherein (i) the first linear array further includes a second ground contact positioned adjacent to the first signal contact, (ii) the second ground contact defines a respective lead portion thereof having a first edge, a second edge opposite the first edge, and a broadside extending from the first edge thereof to the second edge thereof, and (iii) the broadside of the first ground contact overlaps the broadside of the second ground contact.

19. The electrical connector of claim 17, wherein the connector is devoid of electrical shields between the first linear array and the second linear array.

* * * * *

US007462924C1

(12) EX PARTE REEXAMINATION CERTIFICATE (7409th)
United States Patent
Shuey (10) Number: US 7,462,924 C1
(45) Certificate Issued: Mar. 16, 2010

(54) ELECTRICAL CONNECTOR WITH ELONGATED GROUND CONTACTS

(75) Inventor: Joseph Blair Shuey, Camp Hill, PA (US)

(73) Assignee: FCI Americas Technology, Inc., Reno, NV (US)

Reexamination Request:
No. 90/010,407, Feb. 12, 2009

Reexamination Certificate for:
Patent No.: 7,462,924
Issued: Dec. 9, 2008
Appl. No.: 11/477,068
Filed: Jun. 27, 2006

(51) Int. Cl.
*H01R 13/648* (2006.01)

(52) U.S. Cl. .................. 439/607.07; 439/607.05
(58) Field of Classification Search .............. None
See application file for complete search history.

(56) References Cited

U.S. PATENT DOCUMENTS 3,179,904 A    4/1965  Paulsen
3,459,879 A    8/1969  Gerpheide
4,490,690 A   12/1984  Suzuki
4,798,918 A    1/1989  Kabadi et al.
5,611,700 A    3/1997  Mitra
5,764,489 A    6/1998  Leigh et al.
6,350,134 B1   2/2002  Fogg et al.
6,540,559 B1   4/2003  Kemmick et al.
7,473,138 B2   1/2009  Tuin et al.

*Primary Examiner*—P. Tibbits (57) ABSTRACT

In an electrical connector, cross talk between signal contacts in adjacent linear columns and rows may be reduced by changing the size of the lead portions of the contacts extending within a leadframe housing. For example, the height of the ground contact lead portions may be increased to further isolate signal contacts in adjacent columns from interfering electrical fields. The height of the signal contact lead portions may be decreased in order to accommodate the larger ground contact lead portions without increasing the overall size of the connector. Smaller signal contact lead portions may reduce the overall length differential between signal contacts in a differential pair, thereby minimizing signal skew.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3 and 11 are determined to be patentable as amended.

Claims 2–10 and 12–19 were not reexamined.

1. A leadframe assembly for an electrical connector, the leadframe assembly comprising:
   a dielectric leadframe housing; and
   a linear array of electrical contacts, each of the electrical contacts extending through the leadframe housing, the linear array extending along a first direction and including a first ground contact, a first signal contact positioned adjacent to the first ground contact, a second signal contact positioned adjacent to the first signal contact, and a second ground contact positioned adjacent to the second signal contact,
   wherein (i) the first and second ground contacts are separated by a first distance along the first direction, and (ii) each of the first and second ground contacts defines a respective lead portion thereof having a [side length] *height* along the first direction that is greater than the first distance.

3. The leadframe assembly of claim 2, wherein (i) each of the lead portions defines a respective edge width along a second direction that is substantially perpendicular to the first direction, and (ii) each of the edge widths is less than half the [side length] *height* of the lead portion of the first ground contact.

11. A leadframe assembly for an electrical connector, the leadframe assembly comprising:
    a dielectric leadframe housing; and
    a linear array of electrical contacts, each of the electrical contacts extending through the leadframe housing, the linear array extending along a first direction and including a first ground contact, a first signal contact positioned adjacent to the first ground contact, and a second signal contact positioned adjacent to the first signal contact,
    wherein (i) the first signal contact comprises a first lead portion that defines a first centerline, (ii) the second signal contact comprises a second lead portion that defines a second centerline, (iii) the first ground contact comprises a third lead portion that defines a third centerline, (iv) the first and second centerlines are separated by a first distance along the first direction, and (v) the [second] *first* and third centerlines are separated by a second distance along the first direction that is more than twice the first distance.

* * * * *